United States Patent
Shen et al.

(10) Patent No.: US 6,686,853 B2
(45) Date of Patent: *Feb. 3, 2004

(54) METHOD AND APPARATUS FOR ITERATIVE DECODING

(75) Inventors: Ba-Zhong Shen, Irvine, CA (US); Kelly B. Cameron, Irvine, CA (US); Steven T. Jaffe, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/219,858

(22) Filed: Aug. 15, 2002

(65) Prior Publication Data

US 2002/0196165 A1 Dec. 26, 2002

Related U.S. Application Data

(63) Continuation of application No. 09/900,222, filed on Jul. 6, 2001, now Pat. No. 6,518,892.
(60) Provisional application No. 60/246,425, filed on Nov. 6, 2000.

(51) Int. Cl.[7] .................................. H03M 7/00
(52) U.S. Cl. ..................... 341/50; 341/67; 714/760; 714/786
(58) Field of Search .................. 341/50, 51, 67; 714/760, 780, 799, 786, 755, 817, 758, 796, 794; 702/300, 106

(56) References Cited

U.S. PATENT DOCUMENTS

| 4,677,625 | A | 6/1987 | Betts et al. |
| 4,677,626 | A | 6/1987 | Betts et al. |
| 4,979,175 | A | 12/1990 | Porter |
| 5,181,209 | A | 1/1993 | Hagenauer et al. |
| 5,349,608 | A | 9/1994 | Graham et al. |
| 5,406,570 | A | 4/1995 | Berrou et al. |
| 5,446,747 | A | 8/1995 | Berrou |
| 5,563,897 | A | 10/1996 | Pyndiah et al. |
| 5,666,378 | A | 9/1997 | Marchetto et al. |
| 5,675,585 | A | 10/1997 | Bonnot et al. |
| 5,703,911 | A | 12/1997 | Lin et al. |
| 5,721,745 | A | 2/1998 | Hladik et al. |
| 5,734,962 | A | 3/1998 | Hladik et al. |
| 5,742,612 | A | 4/1998 | Gourgue et al. |
| 5,761,248 | A | 6/1998 | Hagenauer et al. |
| 5,784,300 | A | * 7/1998 | Neumeier et al. .......... 702/106 |
| 5,841,818 | A | 11/1998 | Lin et al. |

(List continued on next page.)

FOREIGN PATENT DOCUMENTS

| EP | 0 843 437 A2 | 5/1998 |
| EP | 0891656 B1 | 9/1999 |

(List continued on next page.)

OTHER PUBLICATIONS

Shen et al. "Stopping Criteria For iterative decoding" US Application No. 09/900,222 filed on Jul. 6, 2001.*

(List continued on next page.)

Primary Examiner—Jean Jeanglaude
(74) Attorney, Agent, or Firm—Christie, Parker & Hale, LLP

(57) ABSTRACT

Method and apparatus for determining the stopping point of an iterative decoding process. In one embodiment the estimated values of an iteration of an iterative decoder are provided to a signature circuit. If the signature does not differ from the previous signature developed from a prior iteration, or the signature developed from an iteration prior to the previous iteration, the decoding stops. The variance may also be tested and compared to a threshold as a criteria to stop the iterative decoding.

12 Claims, 8 Drawing Sheets

U.S. PATENT DOCUMENTS

| | | | |
|---|---|---|---|
| 5,907,582 A | 5/1999 | Yi | |
| 5,933,462 A | 8/1999 | Viterbi et al. | |
| 5,970,085 A | 10/1999 | Yi | |
| 5,978,365 A | 11/1999 | Yi | |
| 5,983,384 A | 11/1999 | Ross | |
| 5,983,385 A | 11/1999 | Khayrallah et al. | |
| 5,996,104 A | 11/1999 | Herzberg | |
| 6,016,568 A | 1/2000 | Wolf et al. | |
| 6,182,261 B1 * | 1/2001 | Haller et al. | 714/758 |
| 6,304,996 B1 | 10/2001 | Van Stralen et al. | |
| 6,518,892 B2 * | 2/2003 | Shen et al. | 341/50 |

FOREIGN PATENT DOCUMENTS

| | | |
|---|---|---|
| EP | 0940957 A1 | 9/1999 |
| EP | 0973292 A2 | 1/2000 |
| EP | 0986181 A2 | 3/2000 |
| EP | 1 009 098 A1 | 6/2000 |
| EP | 1030457 A2 | 8/2000 |
| FR | 2724522 A1 | 3/1996 |
| GB | 2346782 A | 8/2000 |
| US | 028690 A | 1/2001 |
| WO | WO-99/19994 A2 | 4/1999 |
| WO | WO-01/43310 A2 | 6/2001 |
| WO | WO-01/43384 A2 | 6/2001 |
| WO | WO 02/19552 A2 | 3/2002 |
| WO | WO-02/21702 A1 | 3/2002 |
| WO | WO-02/23738 A2 | 3/2002 |
| WO | WO-02/23739 A | 3/2002 |
| WO | WO-02/23739 A2 | 3/2002 |
| WO | WO 02/37691 A2 | 5/2002 |
| WO | WO 02/41563 A2 | 5/2002 |

OTHER PUBLICATIONS

Clark, G.C., et al.; "Error–Correction Coding for Digital Communications"; Error Correction Coding for Digital Communication; 1981; pp. 349–352; XP002131001.

Shoemake, Mathew B., et al.; "Turbo Codes for High Order Constellations"; Information Theory Workshop; Jun. 22, 1998; pp. 6–7; XP010297309; IEEE; USA.

Wang, Zhongfeng, et al.; "VLSI Implementation Issues of Turbo Decoder Design for Wireless Applications"; Signal Processing Systems; Oct. 20, 1999; pp. 503–512; XP010370879.

Battail, G., et al.; "Suboptimum decoding using Kullback principle," in Lecture Notes in Computer Science, No. 313, B. Bouchon et al. Eds., 1988, pp. 93–101.

Benedetto, S., et al.; "Parallel Concatenated Trellis Coded Modulation," Jet Propulsion Laboratory, California Institute of Technology, 5 pages. (no date).

Berrou, Claude; "Near Optimum Error Correcting Coding and Decoding: Turbo–Codes," *IEEE Transactions on Communications*, Oct. 1996, pp. 1261–1271, vol. 44, No. 10.

Berrou, Claude, et al.; "Near Shannon Limit Error—Correcting Coding and Decoding: Turbo–Codes," *IEEE International Conference on Communications '93*, Geneva Switzerland, May 23, 1993, pp. 1064–1070, Technical Program, Conference Record, vol. 2/3.

Collins, O. M., et al.; "Iterative Decoding of Non–Systematic Turbo–Codes"; 2000 IEEE International Symposium on Information Theory, Sorrento, Italy, Jun. 25–30, 2000, p. 172, ISBN: 0–7803–5857–0.

Divsalar, D., et al.; "Effective Free Distance of Turbo Codes," *Electronics Letters*, Feb. 29, 1996, pp. 445–446, vol. 32, No. 5.

Dolinar, S., et al.; "Weight Distributions for Turbo Codes Using Random and Nonrandom Permutations," TDA Progress Report 42–122, Jet Propulsion Laboratory, Aug. 1995, pp. 56–65.

Fazel, K., et al.; "Combined Multilevel Turbo–Code with 8PSK Modulation," *Global Telecommunications Conference, 1995. Conference Record. Communication Theory Mini–Conference, GLOBECOM '95. IEEE Singapore*, Nov. 13, 1995, pp. 649–653.

Gross, W.J., et al.; "Simplified MAP Algorithm Suitable for Implementation of Turbo Decoders," *Electronics Letters*, Aug. 6, 1998, pp. 1577–1578, vol. 34, No. 16.

Hagenauer, J., et al.; "Iterative decoding of binary block and convolutional codes," IEEE Trans. on Information theory, vol. 42, Mar. 1996, pp. 429–445.

Heegard, Chris, et al.; *Turbo Coding*, 1999, Kluwer Academic Publishers, Norwell, Massachusetts (entire book).

Hsu, Jah–Ming, et al.; "A Parallel Decoding Scheme for Turbo Codes," *ISCAS '98. Proceedings of the 1998 IEEE International Symposium on Circuits and Systems*, Monterey, CA, May 31, 1998, pp. 445–448.

Kim, B., et al., "Reduction of the number of iterations in turbo decoding using extrinsic information," 1999 IEEE TENCON, pp. 494–497.

Langlais, Charlotte, et al.; "Synchronisation in the Carrier Recovery of a Satellite Link Using Turbo–Codes with the Help of Tentative Decisions," *IEE Colloquium. Turbo Codes in Digital Broadcasting —Could It Double Capacity?*, Nov. 22, 1999, pp. 5/1–7.

Moher, M.; "Decoding via cross–entropy minimization," in Proc, IEEE Globecom Conf., Hoyston, TX, Dec. 1993, pp. 809–813.

Morlet, C., et al.; "A Carrier Phase Estimator For Multi–media Satellite Payloads Suited to RSC Coding Schemes"; IEEE 2000, Jun. 18, 2000, pp. 455–459 vol. 1; ISBN: 0–7803–6283–7.

Pietrobon, Steven S.; "Implementation and Performance of a Turbo/MAP Decoder," a paper submitted to the *International Journal of Satellite Communications*, Feb. 21, 1997, rev. Dec. 4, 1997 and Apr. 2, 1998, 45 pages.

Proakis, J.G.; "Digital Communications" 1991 "Modulation and Demodulation for Additive Gaussian Noise Channel", McGraw–Hill, New York; XP002193198 181370, pp 234–271.

Ramsey, John L.; "Realization of Optimum Interleavers," *IEEE Transactions on Information Theory* May 1970; pp. 338–345; vol. IT–16, No. 3.

Richardson, T., "The geometry of turbo–decoding dynamics," IEEE Trans. on Information Theory, vol. 46, Jan. 2000, pp. 9–23.

Robertson, Patrick, et al.; "Bandwidth–Efficient Turbo Trellis–Coded Modulation Using Punctured Component Codes," *IEEE Journal on Selected Areas in Communications*, Feb. 1998, pp. 206–218, vol. 16, No. 2.

Schlegel, Christian; *Trellis Coding*, 1997, IEEE Press, Piscataway, New Jersey (entire book).

Schurgers, C., et al.; "Energy Efficient Data Transfer and Storage Organization for a MAP Turbo Decoder Module"; XP010355952; Aug. 16, 1999, pp. 76–81, ISBN: 1–58113–133–X.

Sklar, Bernard; *Digital Communications Fundamentals and Applications*, Second Edition, 2001, Prentice Hall PTR, Upper Saddle River, New Jersey (entire book).

Ungerboeck, Gottfried; "Channel Coding with Multilevel/Phase Signals," *IEEE Transactions on Information Theory*, Jan. 1982, pp. 55–66, vol. IT–28, No. 1.

Viterbi, Andrew J.; "An Intuitive Justification and a Simplified Implementation of the MAP Decoder for Convolutional Codes," *IEEE Journal on Selected Areas in Communications*, Feb. 1998, pp. 260–264, vol. 16, No. 2.

Vucetic, Branka, et al.; *Turbo Codes Principles and Applications*, 2000, Kluwer Academic Publishers, Norwell, Massachusetts (entire book).

Yue, Chung–Wai, et al.; "On the FER Performance and Decoding Complexity of Turbo Codes," *1999 IEEE 49th Vehicular Technology Conference*, Houston, TX, May 16, 1999, pp. 2214–2218.

Agrawal, Dakshi, et al.; "On the Phase Trajectories of the Turbo–Decoding Algorithm"; 1999 IMA Summer Program Codes, Systems and Graphical Models; http://www.comm.csl.uiuc.edu/~dakshi; Aug. 3, 1999; pp. 1–22; XP–002207488.

Buckley, Michael E., et al.; "The Design and Performance of a Neural Network for Predicting Turbo Decoding Error with Application to Hybrid ARQ Protocols"; IEEE Transactions on Communications; Apr. 2000; pp. 566–576; vol. 48., No. 4; XP–000932188; IEEE.

Ebel, William J.; "Turbo Code Implementation on the C6x"; Texas Instruments DSPS Fest '99; Aug. 1999; pp. 1–13; XP002207490; Houston, TX.

Rajashekhara, T.M.; "Signature Analyzers in Built–In–Self–Test Circuits: A Perspective"; Proceedings of the 19990 IEEE Southern Tier Technical Conference ; Apr. 25, 1990; pp. 275–281; XP–010010765.

Shao, Rose Y., et al.; "Two Simple Stopping Criteria for Turbo Decoding" IEEE Transactions on ommunications Aug. 8, 1999; pp. 1117–1120; vol. 47, No. 8; XP–000848102; IEEE.

Wu, Yufei, et al., "A Simple Stopping Criterion for Turbo Decoding"; IEEE Communications Letters; Aug. 2000; pp. 258–260; vol. 4, No. 8; XP–000959692.

Internet Papers: "Codes, Systems and Graphical Models"; 1999 IMA Summer Program: http://www.ima.umn.edu/csg/; Aug. 2–13, 1999; pp. 1–6; XP–002207489.

Benedetto, S., et al., "Parallel Concatenated Trellis Coded Modulation," Jet Propulsion Laboratory, California Institute of Technology, 5 pages.

Ramsey, John L., "Realization of Optimum Interleavers," *IEEE Transactions on Information Theory*, May 1970, pp. 338–345, vol. IT–16, No. 3.

Ungerboeck, Gottfried, "Channel Coding with Multilevel/Phase Signals," *IEEE Transactions on Information Theory*, Jan. 1982, pp. 55–66, vol. IT–28, No. 1.

Berrou, Claude, et al., "Near Shannon Limit Error—Correcting Coding and Decoding: Turbo–Codes," *IEEE International Conference on Communications '93*, Geneva Switzerland, May 23, 1993, pp. 1064–1070, Technical Program, Conference Record, vol. 2/3.

Dolinar, S., et al., "Weight Distributions for Turbo Codes Using Random and Nonrandom Permutations," TDA Progress Report 42–122, Jet Propulsion Laboratory, Aug. 1995, pp. 56–65.

Fazel, K., et al., "Combined Multilevel Turbo–Code with 8PSK Modulation," *Global Telecommunications Conference, 1995. Conference Record. Communication Theory Mini–Conference, GLOBECOM '95. IEEE Singapore*, Nov. 13, 1995, pp. 649–653.

Divsalar, D., et al., "Effective Free Distance of Turbo Codes," *Electronics Letters*, Feb. 29, 1996, pp. 445–446, vol. 32, No. 5.

Berrou, Claude, "Near Optimum Error Correcting Coding and Decoding: Turbo–Codes," *IEEE Transactions on Communications*, Oct. 1996, pp. 1261–1271, vol. 44, No. 10.

Pietrobon, Steven S., "Implementation and Performance of a Turbo/MAP Decoder," a paper submitted to the *International Journal of Satellite Communications*, Feb. 21, 1997, rev. Dec. 4, 1997 and Apr. 2, 1998, 45 pages.

Robertson, Patrick, et al., "Bandwidth–Efficient Turbo Trellis–Coded Modulation Using Punctured Component Codes," *IEEE Journal on Selected Areas in Communications*, Feb. 1998, pp. 206–218, vol. 16, No. 2.

Viterbi, Andrew J., "An Intuitive Justification and a Simplified Implementation of the MAP Decoder for Convolutional Codes," *IEEE Journal on Selected Areas in Communications*, Feb. 1998, pp. 260–264, vol. 16, No. 2.

Hsu, Jah–Ming, et al., "A Parallel Decoding Scheme for Turbo Codes," *ISCAS '98 . Proceedings of the 1998 IEEE International Symposium on Circuits and Systems*, Monterey, CA, May 31, 1998, pp. 445–448.

Gross, W.J., et al., "Simplified MAP Algorithm Suitable for Implementation of Turbo Decoders," *Electronics Letters*, Aug. 6, 1998, pp. 1577–1578, vol. 34, No. 16.

Yue, Chung–Wai, et al., "On the FER Performance and Decoding Complexity of Turbo Codes," *1999 IEEE 49th Vehicular Technology Conference*, Houston, TX, May 16, 1999, pp. 2214–2218.

Langlais, Charlotte, et al., "Synchronisation in the Carrier Recovery of a Satellite Link Using Turbo–Codes with the Help of Tentative Decisions," *IEE Colloquium. Turbo Codes in Digital Broadcasting —Could It Double Capacity?*, Nov. 22, 1999, pp. 5/1–7.

Schlegel, Christian, *Trellis Coding*, 1997, IEEE Press, Piscataway, New Jersey (entire book).

Heegard, Chris, et al., *Turbo Coding*, 1999, Kluwer Academic Publishers, Norwell, Massachusetts (entire book).

Vucetic, Branka, et al., *Turbo Codes Principles and Applications*, 2000, Kluwer Academic Publishers, Norwell, Massachusetts (entire book).

Sklar, Bernard, *Digital Communications Fundamentals and Applications*, Second Edition, 2001, Prentice Hall PTR, Upper Saddle River, New Jersey (entire book).

* cited by examiner

FIG.5

TABLE NUMBER 1

| ITERATION | 1 | 2 | 3 | 4 | 5 | 6 | 7 | 8 | 9 | 10 | 11 | 12,13,14,... |
|---|---|---|---|---|---|---|---|---|---|---|---|---|
| BITS ERRORS IN THE BLOCK | 982 | 394 | 87 | 10 | 5 | 5 | 18 | 180 | 110 | 5 | 0 | 0 |

TABLE NUMBER 2

| ITERATION | 1 | 2 | 3 | 4 | 5,6,7,8,... |
|---|---|---|---|---|---|
| BITS ERRORS IN THE BLOCK | 934 | 278 | 26 | 0 | 2 |

TABLE NUMBER 3

| ITERATION | 1 | 2 | 3 | 4 | 5 | 6 | 7 | 8 | 9 | 10 |
|---|---|---|---|---|---|---|---|---|---|---|
| BITS ERRORS IN THE BLOCK | 988 | 390 | 89 | 3 | 2 | 0 | 2 | 0 | 2 | 0 |

FIG. 7

| RATE 2/3 8PSK, 3.7dB 80,000 TESTED BLOCKS | DECODER WITH FIXED 8 ITERATION | DECODER USING SIGNATURE STOPPING CRITERION | |
|---|---|---|---|
| # BLOCKS WITH ERRORS | 95 | 162 | ---MORE BLOCKS W/ERRORS |
| TOTAL BIT ERRORS | 530 | 401 | ---LESS ERRORS/BLOCKS |
| MAXIMAL BIT ERRORS IN A BLOCK | 173 | 6 | |
| BIT ERROR RATE | 3.235e-7 | 2.447e-7 | |
| AVERAGE ITERATIONS | 8 | 5.5 | ---LESS ITERATIONS |
| MAXIMAL ITERATION | 8 | 9(FOUR OUT OF 80,000 BLOCKS) | ---TABLE 4 |

TABLE 4

| ITERATION | 1,2,3 | 4 | 54 | 6 | 7 | 8 | 9 | |
|---|---|---|---|---|---|---|---|---|
| | 0 | 0.0425% | 56.21% | 42.23% | 1.47% | 0.042% | 0.005% | ---TABLE 5 |

TABLE 5

| RATE 2/3 8PSK, 3.7dB 80,000 TESTED BLOCKS | DECODER WITH FIXED 8 ITERATION | DECODER USING SIGNATURE FUNCTION AS A STOP CRITERION | DECODER USING VARIANCE CRITERION TO STOP |
|---|---|---|---|
| # BLOCKS WITH ERRORS | 95 | 162 | 101 |
| TOTAL BIT ERRORS | 530 | 401 | 214 |
| MAXIMAL BIT ERRORS IN A BLOCK | 173 | 6 | 5 |
| BIT ERROR RATE | 3.235e-7 | 2.447e-7 | 1.3660e-7 |
| AVERAGE ITERATIONS | 8 | 5.5 | 5.9 |
| MAXIMAL ITERATION | 8 | 9(FOUR OUT OF 80,000 BLOCKS) | 19(1), 14(1), 12(1), 11(5), 10(8), 9(32) |

TABLE 6

| RATE 2/3 8PSK, 3.7dB 80,000 TESTED BLOCKS | DECODER USING CROSS-ENTROPY CRITERION | DECODER USING SIGNATURE CRITERION | DECODER USING VARIANCE CRITERION |
|---|---|---|---|
| BIT ERROR RATE | 1.4830e-7 | 2.1665e-7 | 1.2145e-7 |
| # AVERAGE ITERATIONS | 5.7 | 5.3 | 5.6 |
| MAXIMAL ITERATION | 11 | 9 | 20(ONLY ONE) |

TABLE 7

METHOD AND APPARATUS FOR ITERATIVE DECODING

CROSS-REFERENCE TO RELATED APPLICATION(S)

This application is a continuation of U.S. patent application Ser. No. 09/900,222, filed Jul. 6, 2001, now U.S. Pat. No. 6,518,892, entitled "STOPPING CRITERIA FOR ITERATIVE DECODING" which claims priority of U.S. Provisional Patent Application No. 60/246,425, filed Nov. 6, 2000, entitled "STOPPING CRITERIA FOR DECODING OF TURBO CODE".

BACKGROUND OF THE INVENTION

A significant amount of interest has recently been paid to channel coding. For example a recent authoritative text states: "Channel coding refers to the class of signal transformations designed to improve communications performance by enabling the transmitted signals to better withstand the effects of various channel impairments, such as noise, interference, and fading. These signal-processing techniques can be thought of as vehicles for accomplishing desirable system trade-offs (e.g., error-performance versus bandwidth, power versus bandwidth). Why do you suppose channel coding has become such a popular way to bring about these beneficial effects? The use of large-scale integrated circuits (LSI) and high-speed digital signal processing (DSP) techniques have made it possible to provide as much as 10 dB performance improvement through these methods, at much less cost than through the use of most other methods such as higher power transmitters or larger antennas." From "Digital Communications" Fundamentals and Applications Second Edition by Bernard Sklar, page 305 © 2000 Prentice Hall PTR.

There are multiple modern decoding methods that involve iterative probabilistic decoding methods. Among the list of iterative probabilistic methods are methods such as MAP decoding, soft output Viterbi decoding and others. Because of the use of iterative decoding techniques, there is a need for improved iterative decoding methods in the art.

SUMMARY OF THE DISCLOSURE

In a first aspect of the invention a method of generating a stopping criteria for an iterative decoder is disclosed. The method includes, performing an Nth iteration of decoding, forming a signature from extrinsic values of the Nth iteration, comparing the signature of the Nth iteration to a signature of the N−1st iteration and stopping the process of iteration decoding if the signature of the N−1st iteration is equal to the signature of the Nth iteration.

In a second aspect of the invention a method of generating a stopping criteria for an iterative decoder is disclosed. The method includes performing an Nth iteration of decoding, forming a signature from extrinsic values of the Nth iteration, comparing the signature of the Nth iteration to a signature of the N−2 iteration and stopping the process of iteration decoding if the signature of the N−2 iteration is equal to the signature of the Nth iteration.

In a third aspect of the invention a method of generating a stopping criteria for an iterative decoder is disclosed. The method includes, determining the variance ($VAR_k$) of extrinsic information on a k'th iteration of the iterative decoder and halting the decoder if $VAR_k < T_1$, where $T_1$ is a first threshold and $D_k$ (Differential Variance)$<T_2$, where $T_2$ is a second threshold.

In a fourth aspect of the invention a method of determining a threshold $T_1$ for a particular encoding is disclosed. The method includes selecting a value for $E_b/N_0$, creating a signal having the particular encoding, adding a noise vector to the signal to create a corrupted signal, iteratively decoding the corrupted signal until the iteration converges and assigning a value less than $VAR_k$ to $T_1$.

BRIEF DESCRIPTION OF THE DRAWINGS

The features, aspects, and advantages of the present invention, which have been described in the above summary, will be better understood with regard to the following description, appended claims and drawings where:

FIG. 5 is a graphical illustration of table 1 through table 3, which illustrate the relationship between decoding iterations to bit errors.

FIG. 7 is a graphical illustration of table 4 through table 7, which illustrate the relationship between decoder iterations, signature stopping criteria, variance criteria and decoding errors.

DETAILED DESCRIPTION OF EMBODIMENTS OF THE INVENTION

Figure 1:
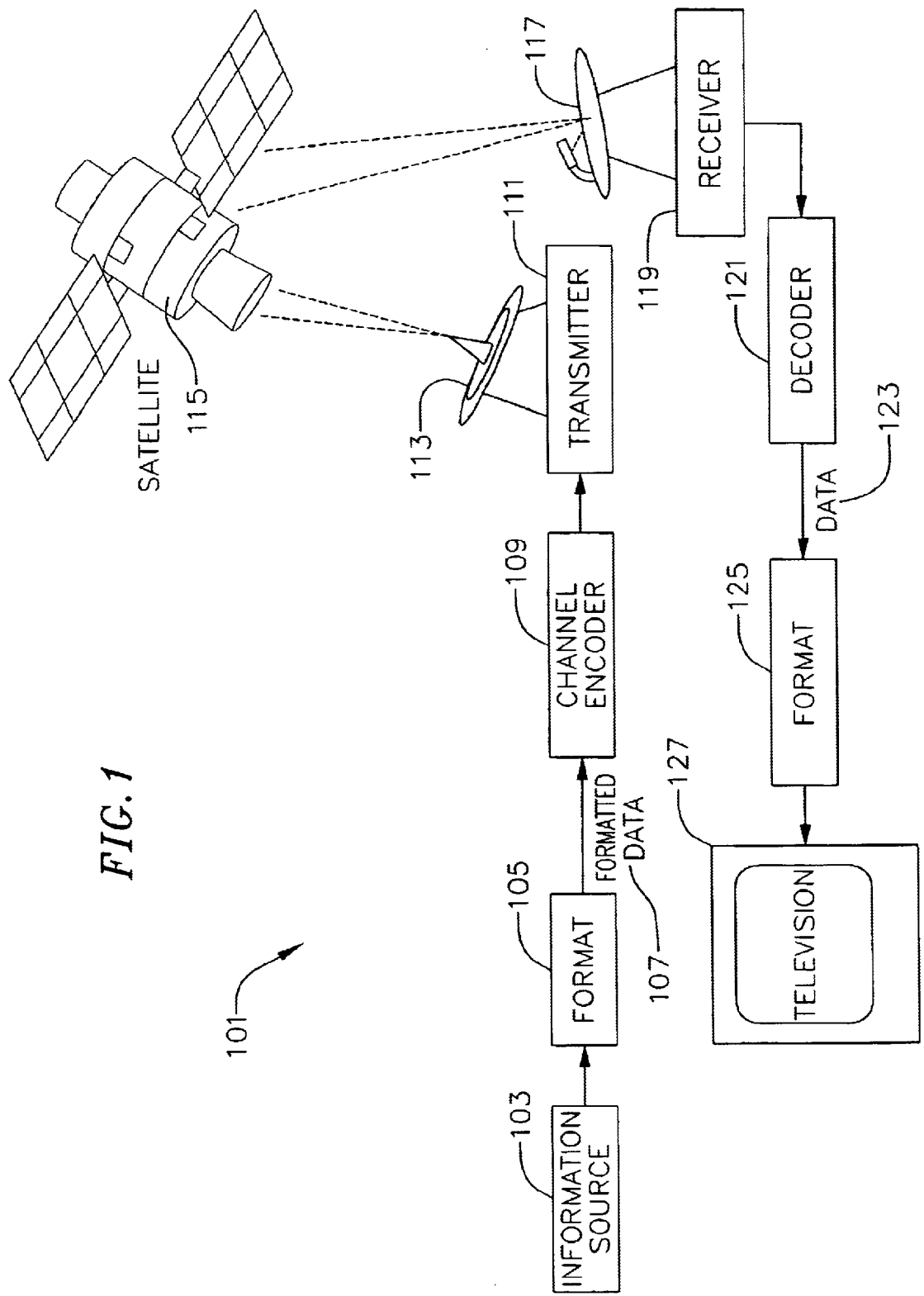
FIG. 1 is a graphical illustration of an environment in which embodiments of the present invention may operate.

FIG. 1 is a graphic illustration of an environment in which embodiments of the present invention may operate. The environment illustrated at 101 is a data distribution system, such as may be found in a cable television distribution system.

In FIG. 1 data is provided to the transmission system by an information source 103. For purposes of illustration, the information source displayed in FIG. 1 may be considered to be a cable television system head end, which provides video data to end users. Embodiments of the invention are not limited to any particular type of information source and any other data source could be equivalently substituted. A formatter 105 accepts data from the information source 103. The data provided by information source 103 may comprise analog or digital signals such as (but not limited to) video signals, audio signals, and data signals. Formatter block 105 formats received data into an appropriate form such as the data illustrated at 107. The formatted data 107 is then provided to a channel encoder 109. Channel encoder 109 encodes the data 107 provided to it. In some embodiments of the present invention, the channel encoder 109 may provide an encoding, which is configured differently dependent on different goals of the particular system. For example, the encoding may be used to make the signal more robust, to reduce the error probability, to operate the system using less transmission power or to enable a more efficient decoding of the signal.

Channel encoder 109 provides encoded data to a transmitter 111. Transmitter 111 transmits the encoded data provided by the channel encoder 109, for example, using an antenna 113. The signal transmitted from antenna 113 is accepted by a relay satellite 115 and then retransmitted to a terrestrial receiving antenna, such as earth station antenna 117. Earth station antenna 117 collects the satellite signal and provides the collected signal to a receiver 119. The receiver 119 amplifies and demodulates/detects the signal as appropriate and provides the detected signal to a decoder 121.

Decoder 121 will, essentially, reverse the process of the channel encoder 109 and recreate the data 123, which should represent a good estimate of the data 107 that had been broadcast. The decoder 121 may use Forward Error Correction (FEC), in order to correct errors in the received signal. The data 123 provided by the decoder are then provided to a formatting unit 125, which prepares the received data for use by an information sink, such as the television illustrated at 127.

Figure 2:
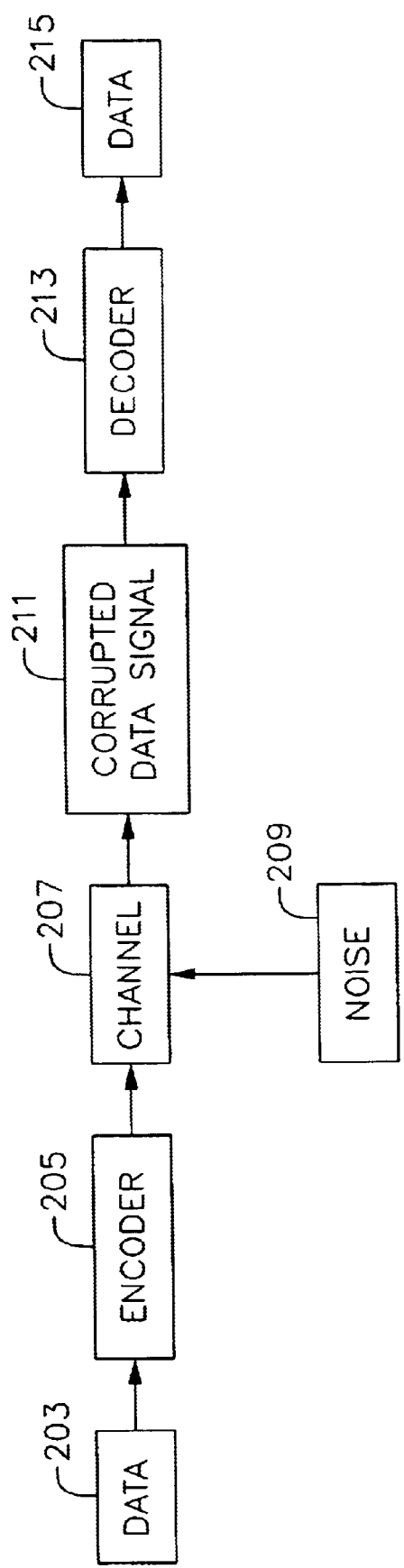
FIG. 2 is a block diagram of a model of a data transmission system.

FIG. 2 is a block diagram illustrating a model of a transmission system. In FIG. 2 data 203 is provided to encoder 205. Encoder 205 may provide different types of encoding depending on the application. For example, encoder 205 may be a trellis encoder, a parallel concatenated encoder (PCE) a low density parity check type encoder (LDPC) or a variety of other types of encoders. After being encoded by encoder 205, the encoded data is then provided to channel 207. Channel 207 comprises a channel driver, the actual channel medium, and a channel receiver. The channel 207 may comprise a variety of different type channel media, such as, but not limited to, radio or fiber optic media.

In the transmission system model, channel 207 also receives an input from a noise block 209. Noise block 209 may comprise a variety of different types of noise from different sources.

The noise introduced to the channel 207 serves to corrupt the encoded signal provided by encoder 205. The result of the addition of noise 209 to the channel 207 is a corrupted data signal 211 representing a combination of the encoded data and added noise. The corrupted data signal 211 is provided to decoder 213. Decoder 213 attempts to decode the corrupted data signal and recreate the original data 203. Decoder 213 provides a data output 215.

The transmission system of FIG. 2 is a model of a real world type communication channel. The decoder illustrated at 213 is a type of decoder known as an "iterative" decoder. Decoder 213 is an iterative decoder because it produces the output data 215 by processing received data and noise multiple times i.e., it makes several iterations through the data. The decoder 213 makes several iterative passes through the received data computing an estimate of the transmitted data, or some other likelihood metric related to the liability of the data estimate produced on each successive pass.

Iterative decoding may be used to decode different types of encoding probabilistically by successfully refining estimates of the data. In such iterative decoding, a first iteration estimate may provide a starting point for a second iteration estimate etc. In such types of iterative decoding, data estimates, for example in the form of probabilities, likelihoods or distance metrics, are passed from one iteration to the next and successively refined and hopefully improved. The output of one iteration of data processing becomes the input to the next iteration of processing.

Several types of codes are amenable to the iterative type of decoding. For example, serial and parallel concatenated codes, also known as serial and parallel turbo codes may be decoded iteratively. Additionally product codes, low density parity check codes (LDPC), Reed Solomon codes, graph codes, and belief propagation codes may be decoded iteratively. While the methods disclosed herein may be used with all the aforementioned codes.

Examples of the inventive concepts herein will be illustrated through the use of parallel concatenated (turbo) codes. Those skilled in the art will realize that the same iterative decoding method that is illustratively applied to turbo codes may be applied equally well to other iterative decodings. The use of turbo codes to illustrate embodiments of the invention is chosen as a matter of convenience, as an example likely to be familiar to those skilled in the art. There is, however, no intent to limit the inventive concepts disclosed herein to turbo codes or any of the example iterative codes mentioned above. The concepts disclosed and explained herein are equally applicable to any iterative decoding method.

Figure 3:
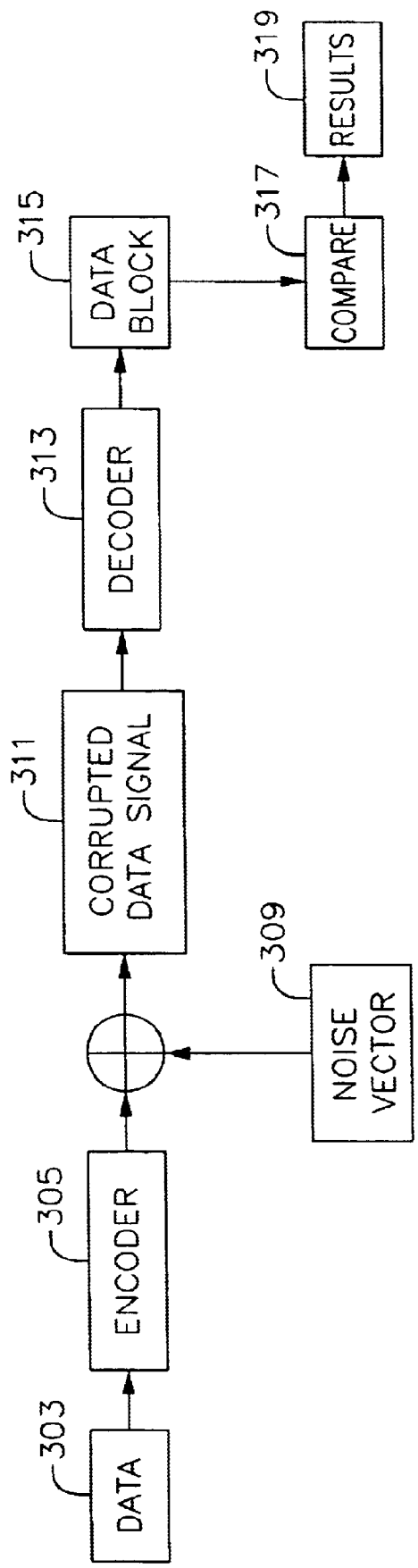
FIG. 3 is a block diagram of a simulation of the transmission system illustrated in FIG. 2.

FIG. 3 is a block diagram of a simulation of the transmission system illustrated in FIG. 2. The simulation of FIG. 3 is used to illustrate, study and quantify the iterative decoding methods disclosed herein. The simulation of FIG. 3 may be programmed entirely on a computer, or may have portions of it realized in a variety of forms. For example, the decoder 313 may be an actual hardware type decoder or a software simulation. For the purposes of simplicity of explanation, the simulation 301 will be treated as a completely software simulation.

Input data 303 may comprise multiple blocks of data. The input data 303 for the software simulation may be contained in a computer file, thus, the data values are known. Data 303 is provided to encoder 305, which will encode the data. A noise vector 309 is added to the encoded data in adder 307. Because the noise vector 309 is a simulated noise vector, the amount of corruption added to the encoded signal can be controlled by controlling the value of the noise vector added. The result of the addition of the encoded data and noise vector 309 in adder 307 is a corrupted data signal 311. The noise and data vector 311 can then be decoded by a decoder 313. Embodiments of the invention may operate within the decoder 313 and may control the decoding of data within decoder 313. Iterations of decoder 313 may be interrupted at any point to analyze the effectiveness of the embodiments of the invention, which control the decoding.

The output of decoder 313 is a data block 315. Data block 315 can be compared with the original data 303 in a comparison unit 317, and the results from any number of iterations saved in a results file 319 for analysis.

By using the simulation of FIG. 3 embodiments of the invention may be tested and analyzed. Throughout the present disclosure test results, arrived at through the use of simulations equivalent to the simulation illustrated in FIG. 3, are used to illustrate various aspects and embodiments of the present invention.

Figure 4:
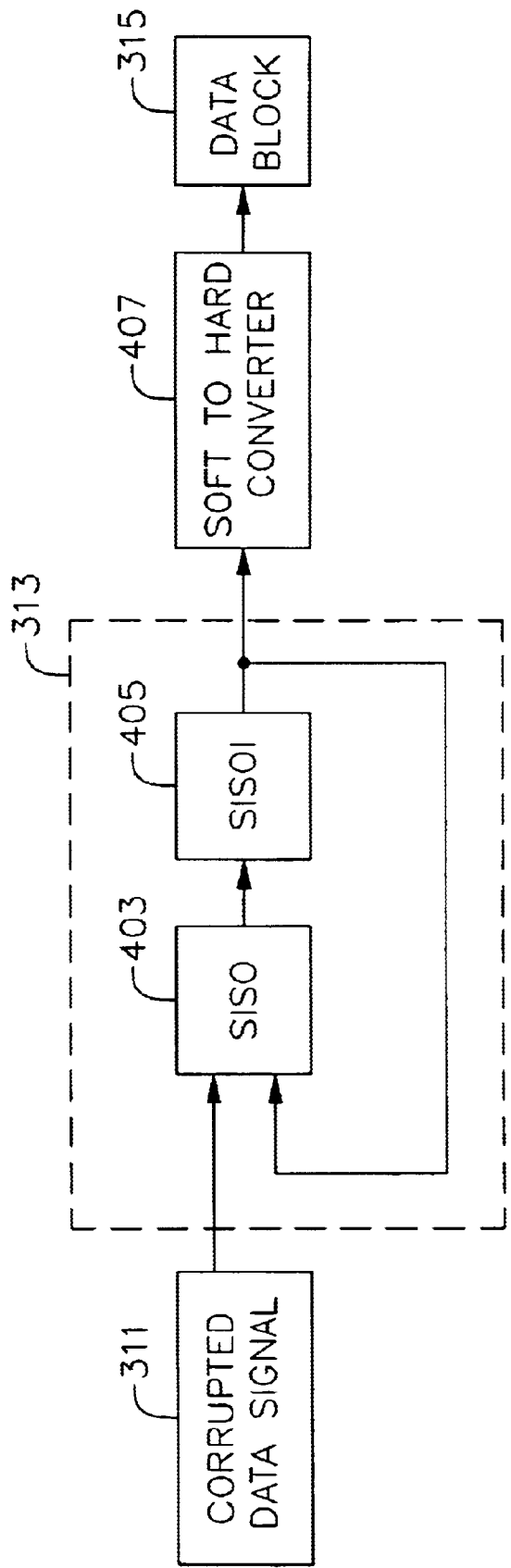
FIG. 4 is a block diagram of a portion of a decoder according to an embodiment of the invention.

FIG. 4 is a block diagram of a portion of an iterative decoder, according to an embodiment of the invention. In FIG. 4, an example decoding system for parallel concatenated (turbo) codes is illustrated, such a decoder within decoding block 313, may be controlled by embodiments of the invention. FIG. 4 assumes that the encoder 305 is a (turbo) encoder.

In FIG. 4, decoder 313 comprises two soft-in soft-out (SISO) component decoders 403 and 405. Such decoders may implement a MAP (Maximum A Posteriori) Algorithm, and hence the decoder may also alternatively be referred to as a MAP decoder or MAP turbo decoder. A soft output to hard output converter 407 receives the output of SISO decoder 405. The converter 407 converts the soft values from SISO decoder 405 to hard output values.

SISO decoder 403 provides a priori values for SISO decoder 405. SISO decoder 405 receives the a priori values from SISO decoder 403 and then provides extrinsic soft values to converter 407, which are converted into hard values. Converter 407 is not a usual part of a turbo decoder. Converter 407 is used to determine the actual data value, which would be decoded if the present decoding iteration were the final iteration. In other words, converter 407 is used to determine how many errors would be present if the current iteration were converted to hard values. The extrinsic values from SISO 405 are also accepted for iterative processing by SISO 403. Using such an arrangement the result produced by any decoder iteration can be analyzed.

Because the output of the SISO 403 and 405 are soft values, they are not merely 0 or 1 values. The soft values produced by the SISO are values that are representative of the value of the signal decoded, and the confidence in the value of the signal decoded as well. For example, the MAP decoders may output values between −7 and +7. A −7 may represent a binary value of 0 with a high confidence. The minus sign indicating a binary 0 and the value of 7 indicating that the value 0 is known with a high degree of confidence. Similarly, a SISO decoder output of −3 would also indicate a digital 0 value, however with less confidence than −7. An output of a −1 would represent a digital 0 with even less confidence than −7 or −3. An output of 0 would indicate that digital values of 1 and 0 are equally likely. In contrast, a +1 would indicate a digital value of 1 with a low level of confidence. A +3 would represent a digital value of 1 with more confidence than a +1, and a value of +7 would represent a digital value of 1 with more confidence than either a +1 or +3.

Since the input data 303 to the simulation comprises hard binary values of 0 or 1, the output of the SISO decoder 405 will be converted to hard, i.e., either 1 or 0, digital values before being compared with the input data block 303. Converter 407 converts the soft output values of SISO 405 into hard digital values.

Once the soft values from SISO 405 are converted to hard values and provided to data block 315, the hard values can be compared with the original data 303.

The simulation of FIG. 3 is useful because data from successive iterations of the decoder 313 can be compared with the original data 303. Once the results of an iteration are compared with the input data 303, a result 319 comprising the number of errors in the data block 315 can be determined.

SISOs 403 and 405 respectively decode two constituent convolutional codes of the turbo encoding being generated by encoder 305. In each iterative decoding cycle, SISOs 403 and 405 output extrinsic information to each other. In each decoder iteration, SISO 405 uses the extrinsic information provided by SISO 403 in the previous iteration. SISO 403 uses the extrinsic information provided by SISO 405 in the previous iteration. SISO 405 also generates a posterior likelihood sequence in each iteration. The posterior likelihood sequence generated by SISO 405 in the k'th iteration can be represented by $Lx_i^k$, where i is the index of the value being decoded. This posterior likelihood sequence is used by soft to hard convertor 407 to generate hard values. If the posterior likelihood sequence in the k'th iteration is equal to the posterior likelihood sequence in the (k−1)th iteration, i.e., $(Lx_i^{k-1})=(Lx_i^k)$ then the posterior likelihood sequence has converged. Convergence, however, may not occur for many iterations. In practice, iterative decoding is commonly halted after a fixed number of iterations.

The accuracy of hard decisions may be inferred from convergence of the posterior likelihood values. In a k'th iteration soft to hard converter 407 accepts the posterior likelihood values $LX_i^k$ and produces corresponding hard values $x_i^k$. If the hard values in a k'th decoder iteration $x_i^k$ match the hard values in a (k−1)th or a (k−2)th iteration i.e. $(x_i^k=x_i^{k-1}$ or $x_i^k=x_i^{k-2})$ then the sequence $x_i^k$ is a fixed point.

The concept of the fixed point is not new. In an article entitled "The geometry of turboing dynamics" by T. Richardson, published in the IEEE Transactions on Information Theory Vol. 46 January 2000, which is incorporated by reference herein, Richardson defined a fixed point in terms of probability density, i.e. $(Lx_i^k)$.

Richardson postulated that if $Lx_i^k$ and $Lx_i^{k-1}$ have the same "bit wise marginal distribution" then $x_L^k$ represents a fixed point. In other words (BZ here we need to say what "bitwise marginal distribution".

After a number of iterations decoder 313 (See FIG. 3) may converge to a fixed point. There, however, may be several fixed points. A fixed point may not necessarily represent a correct reproduction of the data sent. Additionally, some fixed points may not be stable, that is although a fixed point is reached, the decoded values will change if the decoding iterations are continued. That is if the decoder continues its iterations for an additional n iterations a fixed point of further iteration $X_L^{k+n}$ may not correspond to the same value as fixed point $x_i^k$. As an example consider table #1 of FIG. #5.

Table #1 is an example of a simulation of a rate ⅔, 8 Phase Shift Keying (PSK) turbo trellis code having a block length of 10,240 bits. The signal to noise ratio, $E_b/N_0$, used for the simulation is 3.70 dB. This simulation illustrated in table 1 found a non-stable fixed point in the $6^{th}$ iteration. In a sixth iteration, 5 bit errors were found in the decoded block, which is equal to the 5 bit errors found in a fifth iteration of the decoder. The twelfth iteration of the decoder, however, also yielded a stable fixed point.

The simulation illustration in table 1 of FIG. 5 also illustrates, that after the first non-stable fixed point in iteration 6, the decoder begins to propagate errors until, in the eighth iteration, 180 bit errors are present. Accordingly, a decoder operating as in table 1 will actually produce an inferior output if it is stopped in the eighth iteration versus if it is stopped in the sixth iteration. Such a condition were further decoding iterations produce more errors is termed "error propagation". In the course of 80,000 simulations 5 such non-stable fixed points were encountered.

Even when the sequence $x_i^k$ is equal to the bit sequence sent, the sequence $x_i^k$ may not be a fixed point. Such a case is illustrated in table #2 of FIG. 5. In the decoding example illustrated in table #2, the $4^{th}$ iteration produced an output sequence having 0 errors. The fourth iteration, however, is not a fixed point as successive iterations produce a decoding having two errors in each decoded block.

Table 3, of FIG. 5 illustrates a case where two fixed points appear alternatively. The odd iterations, after iteration 4, exhibit 2 errors per decoding, whereas the even iterations, after iteration 4, exhibit 0 errors per decoding.

According to simulations, fixed points are selected to contain less than 10 bit errors. Accordingly, to avoid error propagation, the iterative decoding may be stopped after a fixed point is reached. A mechanism for stopping the decoding on a particular iteration is illustrated in FIG. 6.

Figure 6:
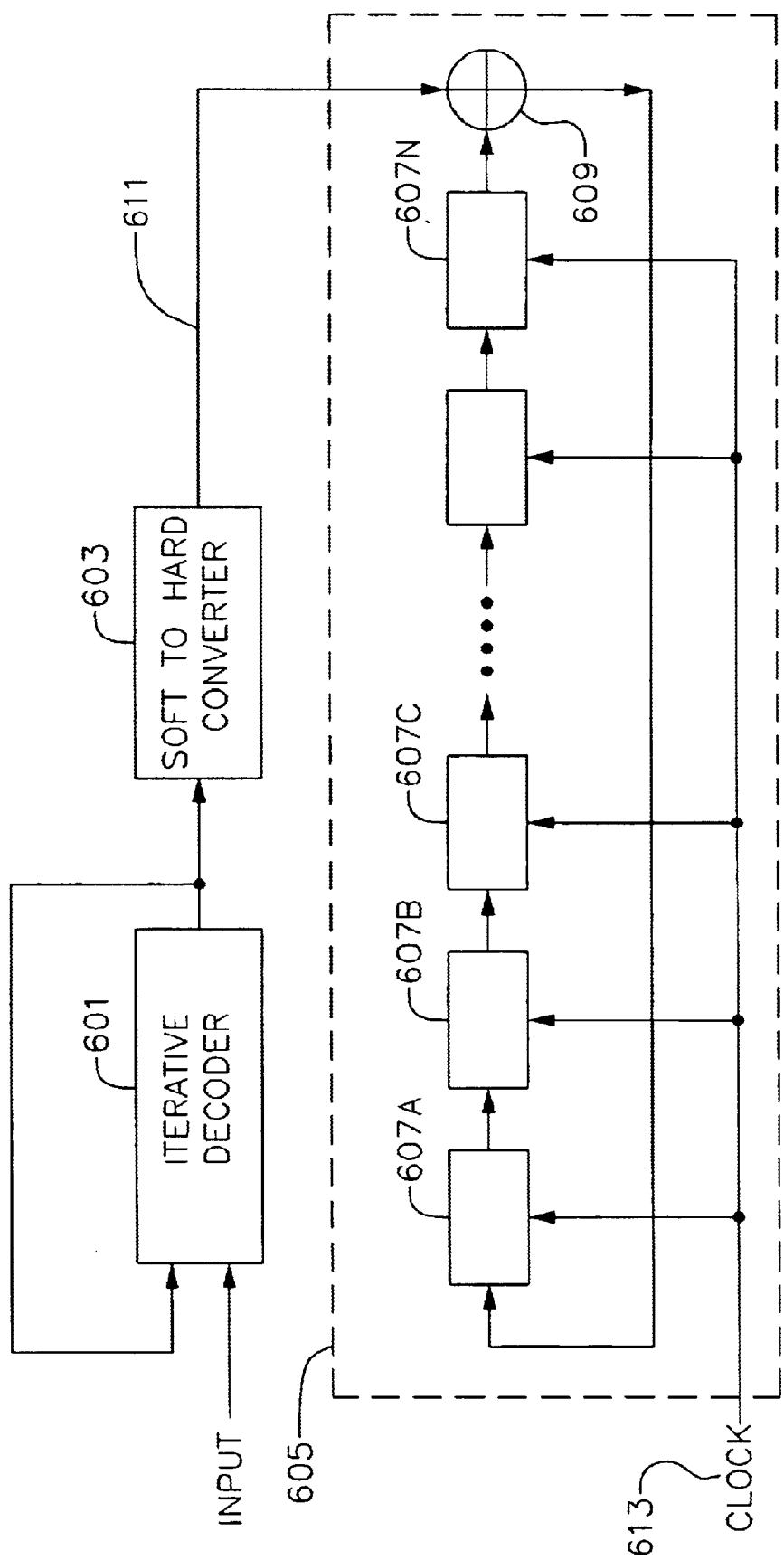
FIG. 6 is a block diagram of a signature circuit, according to an embodiment of the invention.

FIG. 6 is a block diagram of a signature circuit, according to an embodiment of the invention.

In FIG. 6, block 601 represents an iterative decoder, illustratively a turbo-decoder executing a map algorithm (MAP decoder). The SISO comprises two constituent soft in soft out (SISO) decoders. Those skilled in the art will realize that any iterative type or probabilistic decoder could be represented by block 601. Turbo decoding for block 601 has been selected by way of illustration and not limitation.

The output of block 601 is a sequence of soft a posteriori values which are provided to a soft to hard converter 603. The soft to hard converter converts the sequence of soft a posteriori values to a sequence of hard values i.e., 1s and 0s. The sequence of 1s and 0s are the estimate of the sequence sent by the transmitter, as estimated by the current iteration, i.e., of iterative decoder 601. The estimate of the sequence sent from the k'th decoder iteration is provided serially to a signature circuit 605.

The signature circuit 605 comprises a series of data storage elements 607A through 607N, where N is an arbitrary integer, such as 32. The storage elements are arranged serially. That is, for example, storage element 607B accepts its input from the output of storage element 607A. When clocked by clock 613, the value of storage element 607A is clocked into storage element 607B. Storage element 607B is clocked into storage element 607C, and so forth. Storage elements 607 may be a variety of storage elements such as, for example, D-type flip flops. The output of the last storage element 607N is provided to a modulo-2 adder 609. Adder 609 also receives, as a second input, the estimated hard values of the k'th decoder iteration. The output of adder 609 is provided to the input of the first storage device 607A of the signature storage chain 607A through 607N.

After every iteration of the iterative decoder 601 a sequence of soft values, provided by decoder 601, are converted to a sequence of hard values in converter 603. The sequence of hard values produced in converter 603 is then provided to signature circuit 605. The signature of the iteration is the state of the storage device 607A through 607N.

In the current example of FIG. 6, 32 storage devices 607 form the state of the signature circuit 605, and hence the signature is 32 bits. Signature circuits may comprise more or less than 32 bits depending on the size of the block being decoded, the expected signal to noise ratios, and a variety of other factors.

The signature from the k'th iteration is compared to the signature from the K–1, and K–2 iterations. If the signature from the k'th iteration matches the signature from the k–1 or k–2 iteration the iterative decoding stops.

Using 32 bits as the length (the number of memory units) of the signature circuit 605, 80,000 blocks of rate ⅔, 8 phase shift keying (8-psk) Turbo-Trellis Coded Modulation (TTCM) were simulated. The block length of the TTCM code was 10240 symbols of 2 bits each. The $E_b$/No simulated was 3.70 dB. The signature unit was used to generate a stopping criteria for the decoder simulation, as was stopping the decoding after a fixed number (8) of decoding cycles.

The signature unit was initialized to all zeros between iterations and the estimated sequence of hard values was provided to the signature unit. If the signature unit exhibited a value in the k'th iteration equal to the signature value in the k–1 or k–2 teration the decoder was stopped.

The result of simulating the decoding of 80,000 blocks, of rate ⅔ TTCM code, as described previously, is summarized in table 4 of FIG. #6.

The signature criteria yielded more blocks having errors than the decoder having 8 fixed iterations. The signature circuit produced 162 blocks with errors versus 95 for the 8 iteration decoder; however, using the signature criteria produced a smaller number of bit errors, i.e. 401 versus 530, than the 8 iteration decoding. The signature decoding also resulted in a lower bit error rate $2.447e^{-7}$ as opposed to $2.325e^{-7}$ for the 8 iteration decoding.

The signature method only required an average of 5.5 iterations to reach a fixed point. The signature method required a maximum of 9 iterations in 9 of 80,000 blocks decoded. The fixed number of iterations decoder used 8 iterations. The signature method, in addition to being less time consuming, reduced the iterations required from 8 to an average of 5½ iterations. Only 9 of 80,000 blocks required more than 8, i.e. 9, iterations in the decoding.

The signature method stopped the decoding on a variety of different iterations. The iteration on which the signature method are listed by percentage in Table 5. The signature method resulted in less errors, and less time (iterations) to decode, thus showing that not only was iterative decoding time shortened, but that the signature decoding lessened the problem of error propagation into future iterations. Error propagation occurs in a fixed number decoder when a fixed point is reached, but due to the maximum number of iterations not being reached the iterative decoding process continues, with the result that the number of errors in the block is increased over the errors at the fixed point. By avoiding error propagation, resulting from iterative decoding beyond where a fixed point is reached, the decoding is improved by the signature method.

Other stopping criteria have been proposed. For example, in "Reduction of the Number of Iterations in Turbo Decoding Using Extrinsic Information," published in IEEE TenCon, pp. 494–496, which is incorporated by reference, B. Kim and H. Lee proposed a stopping criteria using a variance of extrinsic information. Their method does not work in all decoders. A modified method is proposed herein.

Let $E_k x_l$ denote the extrinsic information of a SISO (Soft In Soft Out) decoder, for example one executing a MAP algorithm, in the k'th iteration. If the mean value, $M_k$, for the k'th iteration is defined as:

$$M_k = \sum_{i=0}^{N-1} \frac{E^k x_i}{\exp(|E^k x_i|)} \qquad \text{Equation 1}$$

Then the variance of the extrinsic information is:

$$VAR_k = \sum_{i=0}^{N-1} \frac{(E^k x_i - M_k)^2}{\exp(|E^k x_i|)} \qquad \text{Equation 2}$$

Where N is the block size of the block being iteratively decoded.

Commonly, for a fixed signal to noise ratio a threshold T exists such that if $VAR_k<T$. The posterior likelihood sequence has converged. This rule, however, has exceptions, and so an additional criterion is needed. Such a criterion is the differential variance $D_k$. $D_k$ is defined as:

$$D_k = |VAR_k - VAR_{k-1}| \qquad \text{Equation 3}$$

A new threshold rule can be stated as follows, halt the iteration of the decoder if:

$$VAR_k < T \qquad \text{Equation 4}$$

or $$VAR_k < T_1 \text{ and } D_k(T_2) \qquad \text{Equation 5}$$

Where $T_1$ and $T_2$ are threshold values. The values for T, $T_1$, and $T_2$ may be determined through the use of simulation, for example, using a simulation such as illustrated in FIG. 3. The threshold selected will depend on the signal to noise ratio, throughout needed, and a variety of other implementation details.

One method to determine thresholds T, $T_1$, and $T_2$, is as follows: A signal to noise ratio is first selected, and a noise vector 309 introduced to accommodate the selected signal to noise ratio. Successive iterations are then examined for number of errors and thresholds T, $T_1$ and $T_2$. The greater the number of simulations, the more accurate the values of T, $T_1$ and $T_2$ may be determined. The threshold values determined will of course depend on such factors as final to noise ratio, code rate etc.

As an illustrative example, a rate ⅔ 8-phase shift keying turbo trellis code modulation with block length 10240 and an $E_b/N_0$=3.70 dB was selected. Using a T and $T_2$ equal to 10 and $T_1$ equal to 100, 80,000 blocks were simulated. The results are illustrated in table 6 of FIG. 7.

In addition to signature criteria, a cross entropy criterion may be employed in determining a stopping criterion for iterative decoding. For example, in "Suboptimum Decoding Using Kullback Principle," published in Lecture Notes in Computer Science, No. 313, B. Bouchon et al. Eds., 1988, pp. 93–101, G. Battail and R. Sfes, which is incorporated by reference, the idea of decoding using cross entropy minimization is discussed. Additionally, in "Iterative Decoding of Binary Block and Convolutional Codes," published in the IEEE, Transactions on Information Theory, Volume 42, March 1996, pp. 429–445, which is hereby incorporated by reference, J. Hagenauer, E. Offer and L. Papke discuss cross entropy.

If a decoder, illustratively a turbo decoder comprising 2 SISO units, produces a sequence of extrinsic information, the extrinsic information from the first SISO may be represented as $E_1^k x_i$, and the second SISO may be represented as $E_2^k x_i$, The cross entropy can then be defined as:

$$T_{(k)} = \sum_{i=0}^{N-1} \frac{|E_2^k x_i - E_2^{k-1} x_i|^2}{\exp(|E_1^k x_i + E_2^k x_i|)} \qquad \text{Equation 6}$$

The decoder can then terminate the decoding process by testing the value of $T_{(K)}/T_{(1)}$ to see if it is less than some predetermined threshold. As previously, the threshold for a particular signal to noise ratio may be determined through the use of simulations using simulation such as illustrated in FIG. 3.

A comparison of the simulation of 80,000 blocks of rate ⅔, 8 psk turbo trellis coded modulated code, with an $E_b/N_0$=3.75 dB was simulated. The results are as seen in table 7 of FIG. 7.

Figure 8:
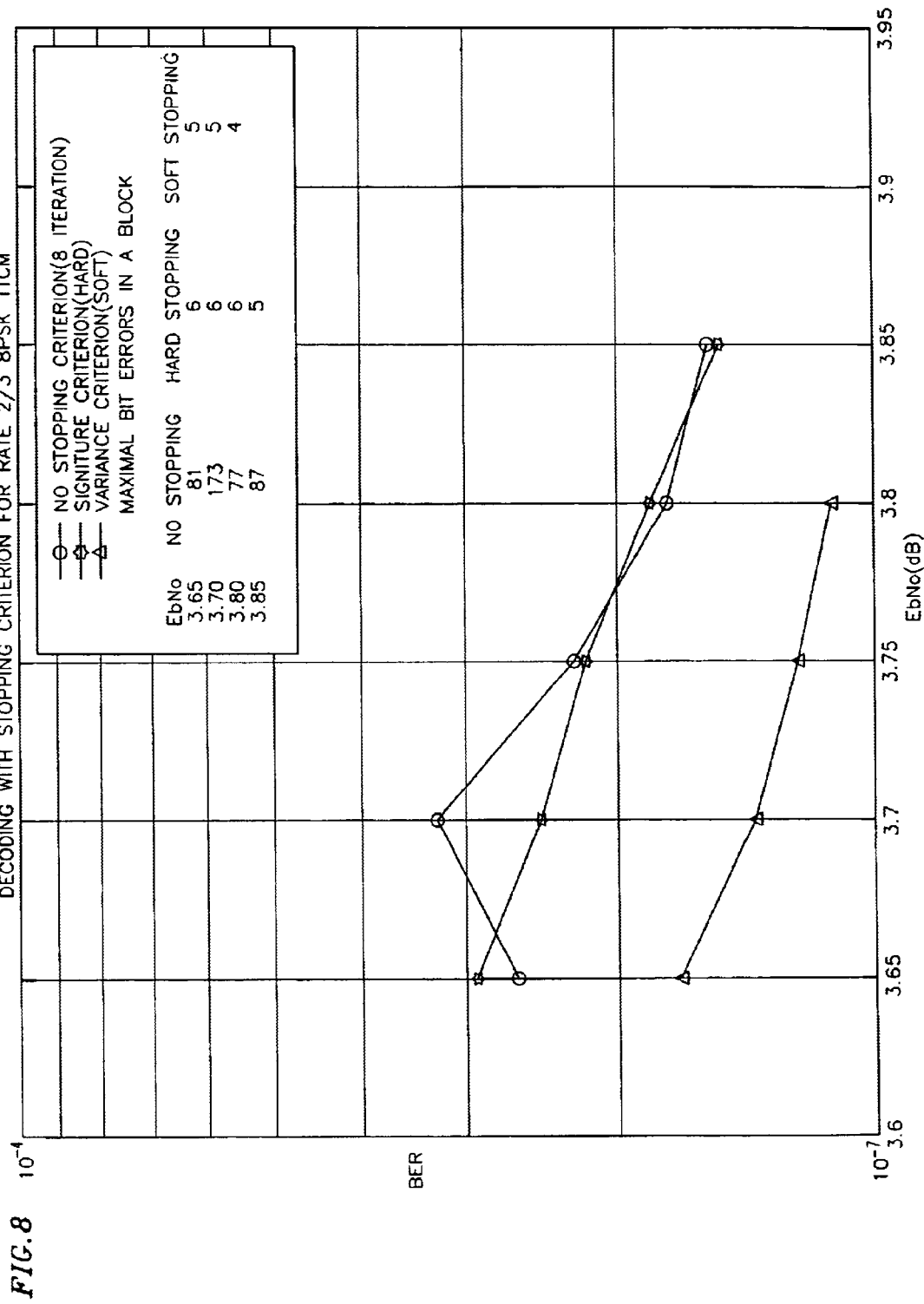
FIG. 8 is a graph illustrating bit error rate (BER) verses $E_b/N_0$ for various stopping criteria.
Figure 8:
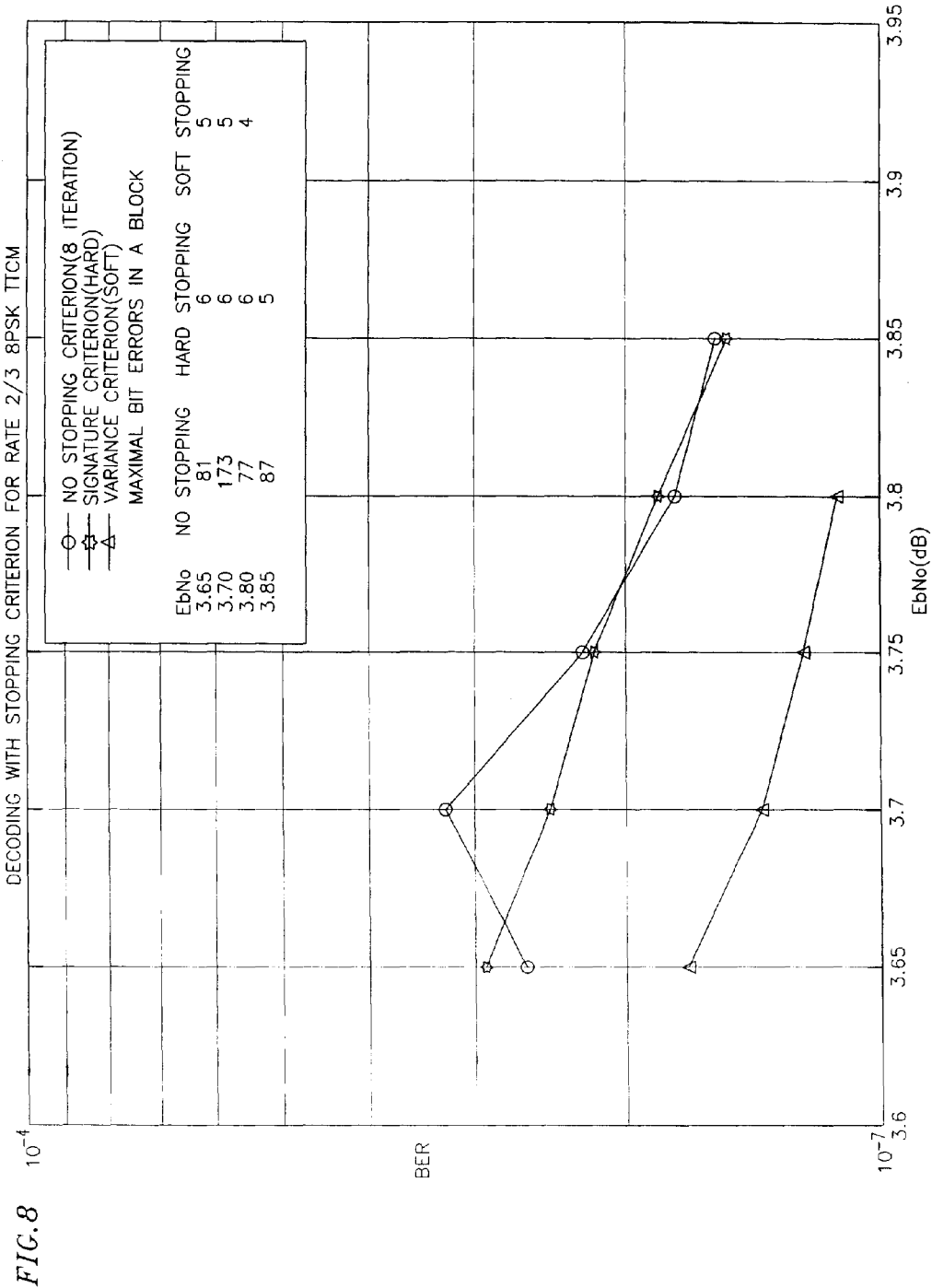

FIG. 8 is a graph illustrating bit error rate versus $E_b/N_0$ for various stopping criteria. As can be seen, the signatures criteria produces a bit error rate (BER) superior to the 8 iteration decoding at an $E_b/N_0$ of 3.75 dB. The variance stopping criteria produces a BER superior to the 8 iteration decoding at all tested $E_b/N_0$.

What is claimed is:

1. A method for iteratively decoding a data signal, the method comprising:

receiving a corrupted data signal from a transmission channel;

iteratively decoding the received data signal;

creating a signature from values of an Nth decoding iteration comparing the signature of the Nth iteration to a signature of an N−1 iteration;

stopping the process of iterative decoding if the signature of the N−1 iteration is equal to the signature of the Nth iteration; and outputting a decoded data signal related to the received corrupted data signal.

2. The method of claim 1 wherein the creating of the signature comprises:

receiving extrinsic values from the Nth iteration;

converting the extrinsic values into hard values; and accumulating the hard values in a signature circuit to form a signature.

3. The method of claim 2 wherein the accumulating the hard values comprises:

receiving the hard values in a combinational circuit;

receiving the output of a buffer in the combinational circuit;

forming a combinational value from a hard value and the output of the buffer;

providing the combinational value to the input of the buffer; and reading the state of the buffer to provide a signature value.

4. A method for iteratively decoding a data signal, the method comprising:

receiving a corrupted data signal from a transmission channel;

iteratively decoding the received data signal;

creating a signature from values of an Nth decoding iteration;

comparing the signature of the Nth iteration to a signature of an N−2 iteration;

stopping the process of iterative decoding if the signature of the N−2 iteration is equal to the signature of the Nth iteration; and outputting a decoded data signal related to the received corrupted data signal.

5. The method of claim 4 wherein the creating of the signature comprises:

receiving extrinsic values from the Nth iteration;

converting the extrinsic values into hard values; and accumulating the hard values in a signature circuit to form a signature.

6. The method of claim 5 wherein the accumulating the hard values in a signature circuit comprises:

receiving the hard values in a combinational circuit;

receiving the output of a buffer into the combinational circuit;

forming a combinational value from a hard value and the output of the buffer;

providing the combinational value to the input of the buffer; and reading the state of the buffer to provide a signature value.

7. An iterative decoder comprising:

a receiver for receiving a corrupted data signal from a transmission channel;

means for iteratively decoding the received data signal;

means for generating a signature from values of an Nth decoding iteration;

means for comparing the signature of the Nth iteration to a signature of an N–1 iteration;

means for stopping the process of iterative decoding if the signature of the N–1 iteration is equal to the signature of the Nth iteration; and an output for outputting a decoded data signal related to the received corrupted data signal.

8. The iterative decoder of claim 7 wherein the means for generating a signature comprises:

means for receiving extrinsic values from the Nth iteration;

a converter for converting the extrinsic values into hard values; and a signature circuit for accumulating the hard values to form a signature.

9. The iterative decoder of claim 8 wherein the signature circuit comprises:

a combinational circuit for receiving the hard values;

means for receiving the output of a buffer in the combinational circuit;

means for forming a combinational value from a hard value and the output of the buffer;

means for providing the combinational value to the input of the buffer; and means for reading the state of the buffer to provide a signature value.

10. An iterative decoder comprising:

a receiver for receiving a corrupted data signal from a transmission channel;

means for iteratively decoding the received data signal;

means for generating a signature from values of an Nth decoding iteration;

means for comparing the signature of the Nth iteration to a signature of an N–2 iteration;

means for stopping the process of iterative decoding if the signature of the N–2 iteration is equal to the signature of the Nth iteration; and an output for outputting a decoded data signal related to the received corrupted data signal.

11. The iterative decoder of claim 10 wherein the means for generating a signature comprises:

means for receiving extrinsic values from the Nth iteration;

a converter for converting the extrinsic values into hard values; and a signature circuit for accumulating the hard values to form a signature.

12. The iterative decoder of claim 11 wherein the signature circuit comprises:

a combinational circuit for receiving the hard values;

means for receiving the output of a buffer in the combinational circuit;

means for forming a combinational value from a hard value and the output of the buffer;

means for providing the combinational value to the input of the buffer; and means for reading the state of the buffer to provide a signature value.

* * * * *

UNITED STATES PATENT AND TRADEMARK OFFICE
CERTIFICATE OF CORRECTION

PATENT NO. : 6,686,853 B2
DATED : February 3, 2004
INVENTOR(S) : Shen et al.

It is certified that error appears in the above-identified patent and that said Letters Patent is hereby corrected as shown below:

Title page
Item [56], References Cited, U.S. PATENT DOCUMENTS, insert the following:
-- 6,065,147 A 05/2000 Pyndiah, et al.
6,119,264 A 09/2000 Berrou, et al.
6,122,763 A 09/2000 Pyndiah, et al. --.
FOREIGN PATENT DOCUMENTS, delete "WO WO-02/23739 A 3/2002"
OTHER PUBLICATIONS,
"Moher, M.; "Decoding via crossenthropy... " reference, delete "Hoyston", insert
-- Houston --.
"Ramsey, John L.; "Realization of Optimum... " reference, after "Information Theory", insert -- , --.
Delete "Rajashekhara, T.M.; "Signature Analyzers in Built-In-Self-Test Circuits: A Perspective"; Proceedings of the 19990", insert -- Rajashekhara, T.N.; "Signature Analyzers in Built-In-Self-Test Circuits: A Perspective"; Proceedings of the 1990 --.
"Shao, Rose Y., et al.; "Two Simple Stopping... " reference, delete "on ommunications", insert -- on Communications --.
"Wu, Yufei, et al.; "A Simple Stopping... " reference, after "XP-000959692", insert -- ; IEEE --.
Delete all reference after "Internet Papers: "Codes, Systems and Graphical Models"; 1999 IMA Summer Program: http://www.ima.umn.edu/csg/; Aug. 2-13, 1999; pp. 1-6; XP-002207489."

Delete Drawing Sheet 8 of 8, FIG. 8, and substitute therefore the Drawing Sheet, consisting of Fig. 8, as shown on the attached page.

Column 10,
Line 8, After "Nth decoding iteration", insert -- ; --.

Signed and Sealed this

Thirteenth Day of September, 2005

JON W. DUDAS
*Director of the United States Patent and Trademark Office*